(12) United States Patent
Thornes et al.

(10) Patent No.: US 10,727,642 B2
(45) Date of Patent: Jul. 28, 2020

(54) ONLINE CALIBRATION FOR REPETITION RATE DEPENDENT PERFORMANCE VARIABLES

(71) Applicants: Cymer, LLC, San Diego, CA (US); ASML NETHERLANDS B.V., Veldhoven (NL)

(72) Inventors: Joshua Jon Thornes, San Diego, CA (US); Tanuj Aggarwal, San Diego, CA (US); Kevin Michael O'Brien, San Diego, CA (US); Frank Everts, Eindhoven (NL); Herman Philip Godfried, Amsterdam (NL); Russell Allen Burdt, San Diego, CA (US)

(73) Assignees: Cymer, LLC, San Diego, CA (US); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/700,754

(22) Filed: Sep. 11, 2017

(65) Prior Publication Data

US 2018/0006425 A1 Jan. 4, 2018

Related U.S. Application Data

(63) Continuation-in-part of application No. 14/976,829, filed on Dec. 21, 2015, now Pat. No. 9,762,023.

(51) Int. Cl.
*G03F 7/20* (2006.01)
*H01S 3/13* (2006.01)
(Continued)

(52) U.S. Cl.
CPC .......... *H01S 3/1305* (2013.01); *G01J 1/0228* (2013.01); *G03F 7/70041* (2013.01);
(Continued)

(58) Field of Classification Search
CPC .. G01J 11/00; G03F 7/70041; G03F 7/70141; G03F 7/70516; G03F 7/7055;
(Continued)

(56) References Cited

U.S. PATENT DOCUMENTS

2003/0031216 A1   2/2003   Fallon et al.
2003/0118072 A1   6/2003   Wittak et al.
(Continued)

FOREIGN PATENT DOCUMENTS

JP   2004158565 A   6/2004
JP   2008098282 A   4/2008

OTHER PUBLICATIONS

Office Action issued in JP Application No. 2018-522627 dated Jul. 2, 2019, 9 pages total (with English Translation).

*Primary Examiner* — Colin W Kreutzer
(74) *Attorney, Agent, or Firm* — DiBerardino McGovern IP Group LLC

(57) ABSTRACT

Online calibration of laser performance as a function of the repetition rate at which the laser is operated is disclosed. The calibration can be periodic and carried out during a scheduled during a non-exposure period. Various criteria can be used to automatically select the repetition rates that result in reliable in-spec performance. The reliable values of repetition rates are then made available to the scanner as allowed values and the laser/scanner system is then permitted to use those allowed repetition rates.

31 Claims, 7 Drawing Sheets

(51) Int. Cl.
*H01S 3/036* (2006.01)
*H01S 3/23* (2006.01)
*H01S 3/097* (2006.01)
*H01S 3/038* (2006.01)
*H01S 3/137* (2006.01)
*G01J 1/02* (2006.01)
*H01S 3/225* (2006.01)
*H01S 3/1055* (2006.01)
*G01J 1/42* (2006.01)

(52) U.S. Cl.
CPC ........ *G03F 7/7055* (2013.01); *G03F 7/70516* (2013.01); *G03F 7/70558* (2013.01); *G03F 7/70575* (2013.01); *H01S 3/036* (2013.01); *H01S 3/0385* (2013.01); *H01S 3/09702* (2013.01); *H01S 3/137* (2013.01); *H01S 3/2308* (2013.01); *H01S 3/2333* (2013.01); *G01J 1/4257* (2013.01); *H01S 3/1055* (2013.01); *H01S 3/225* (2013.01); *H01S 3/2251* (2013.01); *H01S 3/2256* (2013.01)

(58) Field of Classification Search
CPC .... G03F 7/70558; H01S 3/0014; H01S 3/005; H01S 3/10046; H01S 3/10069; H01S 3/13; H01S 3/1305
USPC .......................... 355/67–69, 77; 372/25, 30
See application file for complete search history.

(56) References Cited

U.S. PATENT DOCUMENTS

| | | |
|---|---|---|
| 2005/0226287 A1 | 10/2005 | Shah et al. |
| 2008/0149862 A1 | 6/2008 | Hansson et al. |
| 2008/0300662 A1 | 12/2008 | Taylor |
| 2009/0245300 A1* | 10/2009 | Sun ...................... H01S 3/0941 372/25 |
| 2011/0116522 A1 | 5/2011 | Riggs et al. |
| 2013/0003773 A1 | 1/2013 | O'Brien et al. |
| 2013/0294465 A1 | 11/2013 | Chang |
| 2015/0117480 A1 | 4/2015 | Karavitis |

\* cited by examiner

ONLINE CALIBRATION FOR REPETITION RATE DEPENDENT PERFORMANCE VARIABLES

CROSS-REFERENCE TO RELATED APPLICATION

This application is a continuation-in-part of application Ser. No. 14/976,829 filed Dec. 21, 2015, the specification of which is hereby incorporated by reference in its entirety.

FIELD

The present disclosure relates to online calibration of a laser source that produces radiation in the deep ultraviolet ("DUV") portion of the electromagnetic spectrum.

BACKGROUND

Laser radiation for semiconductor photolithography is typically supplied as a series of pulses at a specified repetition rate. In order to achieve process uniformity, it is desirable that the laser be able to meet a set of performance specifications such as a bandwidth, wavelength, and energy stability under all anticipated operating conditions. These laser performance parameters may be affected by the repetition rate at which the laser performs. Because of this it cannot be assumed that the laser will meet performance specifications at all of the repetition rates at which it is able to operate. It may be desired, however, to have the option of being able to operate at different repetition rates. For example, a common method of changing the output power of the laser is to reduce the repetition rate rather than to reduce the output energy per pulse.

It is possible to engineer around unknown variation of performance with repetition rate by operating the laser at a fixed repetition rate (for example, 6 kHz). This has the disadvantage, however, that if it is desired to use a lower effective repetition rate, the scanner associated with the laser source must block or otherwise attenuate pulses, because the actual number of pulses originating from the laser will remain the same. This means that more laser pulses are used for wafer production than would be necessary if the actual laser repetition rate could be reduced when desired.

There is thus a need be able to provide a laser source that can be operated at any one of a multiplicity of available repetition rates without concerns that the laser source may not be operating within acceptable performance specifications.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, disclosed is a system comprising a laser, a laser control unit operatively connected to the laser for controlling the laser to scan through a plurality of scanned repetition rates, a measurement unit arranged to measure an output from the laser for measuring at least one operating parameter of the laser for at least some of the scanned repetition rates, the operating parameter being laser gain or laser efficiency, and an evaluation unit operatively connected to the measurement unit for making a determination of whether a measured value for the operating parameter is within a predetermined range of values for the operating parameter for the at least some of the scanned repetition rates and providing an indication of the result of the determination, the laser control unit being operatively connected to the evaluation unit and configured to permit or recommend operation of the laser at one of the scanned repetition rates only if the value stored in association with the scanned repetition rate indicates that the operating parameter was measured to be within the predetermined range for that scanned repetition rate. The laser control unit may be configured to step the laser through a series of repetition rates where the difference in repetition rate between steps is maintained substantially constant. The laser control unit may be configured to step the laser through a series of repetition rates where the difference in repetition rate between steps is increased with repetition rate. The laser control unit may be configured to step the laser through a series of repetition rates where the difference in repetition rate between steps is decreased with repetition rate. The laser control unit may be configured so that the difference in repetition rate is any positive function (even random) of repetition rate.

According to another aspect, disclosed is a system comprising an illumination system, the illumination system including a laser capable of running at multiple repetition rates, a laser control unit operatively connected to the laser for driving the laser to operate at one of a plurality of repetition rates, a measurement unit arranged to measure an output from the laser for measuring at least one operating parameter of the laser for each of the plurality of repetition rates, and a scoring unit operatively connected to the measurement unit for determining scoring information for each of the plurality of repetition rates based at least in part on the measured operating parameter; and a scanning system arranged to receive the scoring information from the scoring unit, the scanning system including a scanning system control unit and a memory for storing process data, the scanning system control unit determining which repetition rates to use based at least in part on the scoring information and the process data.

According to another aspect, disclosed is a photolithography tool including an illumination system and a scanner, wherein the illumination system includes a module configured to generate a score for each of a plurality of repetition rates based on a respective performance characteristic of the illumination system at each of a plurality of repetition rates and wherein the scanner is arranged to receive the scores and causes the illumination system to operate at a determined repetition rate based on the score of that determined repetition rate and information about a current process. The information may be a recipe for the current process.

According to another aspect, disclosed is a method carried out by a photolithography tool including an illumination system and a scanner, the method comprising the steps of a step, performed by the illumination system, of generating a plurality of scores for respective repetition rates and a step, performed by the scanner, of determining at which repetition rates to operate the illumination system based at least in part on the scores. The scanner may be provided with process information and the scanner may then perform the step of determining at which repetition rates to operate the illumination system based at least in part on the process information.

According to another aspect, disclosed is a system comprising a laser capable of running at multiple repetition rates, a laser control unit operatively connected to the laser for driving the laser to operate sequentially at each of a plurality of repetition rates, a measurement unit arranged to measure an output from the laser for measuring at least one operating parameter of the laser for each of the plurality of repetition rates, a scoring unit operatively connected to the measurement unit for determining a score for each of the plurality of repetition rates based at least in part on the measured operating parameter, a storage unit operatively connected to the scoring unit for storing an ensemble of scores respectively for each of the plurality of repetition rates, an analyzer operatively connected to the scoring unit for determining at least one statistical characteristic of the ensemble, and a controller operatively connected to the analyzer for adjusting a system condition to alter the statistical characteristic.

According to another aspect, disclosed is a method comprising the steps of operating a laser to run a scan through each of a plurality of repetition rates, measuring a respective operating parameter for each of the plurality of repetition rates, and selecting a set of operational repetition rates based at least in part on the respective operating parameters measured by the measurement unit. The method may further include a step conducted before scanning of selecting a group of one or more repetition rates to be excluded from the scan and wherein the scanning step comprises excluding the group of repetition rates from the scan. The selecting step may comprise including in the group rates that are predetermined to result in unacceptable performance for the laser, or including in the group rates that are predetermined to result in acceptable performance for the laser, or selecting rates that are determined dynamically to be excluded from the scan during an exposure. Inclusion in the group may be determined prior to an exposure period of the laser, or dynamically during an exposure period of the laser. Values for one or more repetition rates which were not measured during the scanning step may be obtained from interpolation of a plurality of values for repetition rates which were measured during the scanning step. Laser output power may be held substantially constant during each scan for each repetition rate in the scanning step. Laser duty cycle may be held substantially constant during each scan of for each repetition rate in the scanning step. Laser output power may be selected to have a random value during each scan of for each repetition rate in the scanning step. Laser duty cycle may be selected to have a random value during each scan of for each repetition rate in the scanning step.

According to another aspect, disclosed is a system comprising a laser, a laser control unit operatively connected to the laser for controlling the laser to scan through a plurality of scanned repetition rates, a measurement unit arranged to measure a value of an operating parameter of the laser respectively for each scanned repetition rate, a storage unit operatively connected to the measurement unit for storing scan data in the form of an indication of the value respectively for each of the plurality of scanned repetition rates, and a controller operatively connected to the storage unit for altering operation of the system based on the scan data. The controller may adjust bandwidth change across the scanned repetition rates. The controller may also or alternatively adjust other properties, such as gain change, offset change, maximum bandwidth, and peak energy sigma.

According to another aspect, disclosed is a system comprising a laser capable of running at multiple repetition rates, a laser control unit operatively connected to the laser for driving the laser to operate sequentially at each of a plurality of repetition rates, a measurement unit arranged to measure an output from the laser for measuring at least one operating parameter of the laser for each of the plurality of repetition rates, a scoring unit operatively connected to the measurement unit for determining a score for each of the plurality of repetition rates based at least in part on the measured operating parameter, a storage unit operatively connected to the scoring unit for storing an ensemble of scores respectively for each of the plurality of repetition rates, and a controller operatively connected to access data in the storage unit wherein the controller compares multiple scores in the ensemble to determine an operational repetition rate at which to operate the laser.

DETAILED DESCRIPTION

Figure 1:
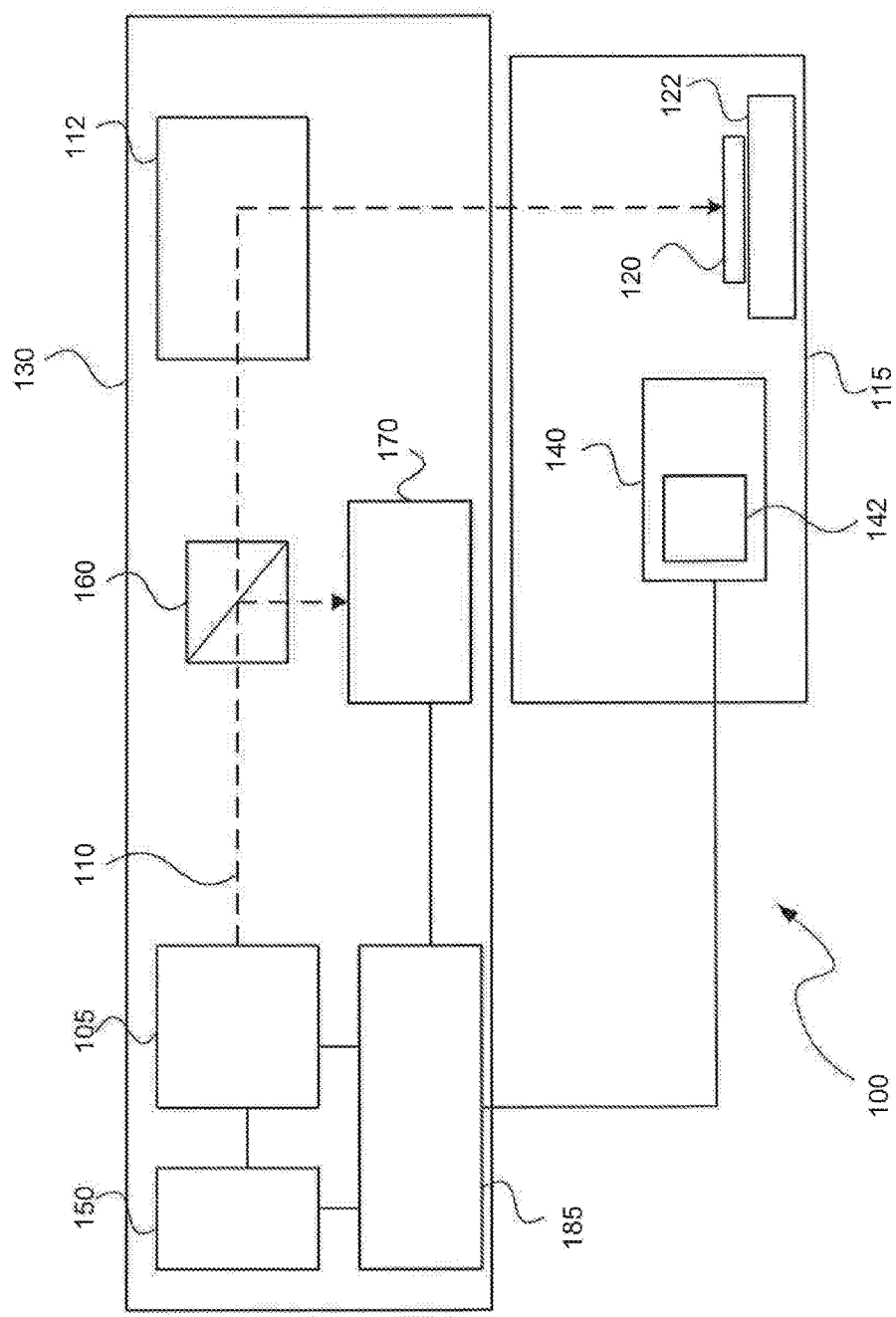
FIG. 1 shows a schematic, not to scale, view of an overall broad conception photolithography system according to an aspect of the present invention.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Referring to FIG. 1, a photolithography system 100 that includes an illumination system 130. The illumination system 130 includes an optical source 105 that produces a pulsed light beam 110 and directs it to a photolithography exposure apparatus or scanner 115 that patterns microelectronic features on a wafer 120. The wafer 120 is placed on a wafer table 122 constructed to hold wafer 120 and connected to a positioner configured to accurately position the wafer 120 in accordance with certain parameters. The light beam 110 is also directed through a beam preparation system 112, which can include optical elements that modify aspects of the light beam 110. For example, the beam preparation system 112 can include reflective or refractive optical elements, optical pulse stretchers, and optical apertures (including automated shutters).

The photolithography system 100 uses a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy or power of the light beam 110 is distributed over different wavelengths. The lithography system 100 also includes a measurement (or metrology) system 170, and a control system 185. The metrology system 170 measures one or more spectral features (such as the bandwidth and/or the wavelength) of the light beam. The metrology system 170 preferably includes a plurality of sensors. Details concerning a possible implementation of a metrology system are disclosed in U.S. Published Application No. 2016/0341602, titled "Spectral Feature Metrology of a Pulsed Light Beam," published Nov. 24, 2016, and commonly assigned to the assignee of this application, the entire disclosure of which is hereby incorporated by reference.

The metrology system 170 receives a portion of the light beam 110 that is redirected from a beam separation device 160 placed in a path between the optical source 105 and the scanner 115. The beam separation device 160 directs a first portion of the light beam 110 into the metrology system 170 and directs a second portion of the light beam 110 toward the scanner 115. In some implementations, the majority of the light beam is directed in the second portion toward the scanner 115. For example, the beam separation device 160 directs a fraction (for example, 1-2%) of the light beam 110 into the metrology system 170. The beam separation device 160 can be, for example, a beam splitter.

The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illuminator system adjusts the range of angles for the light beam 110 impinging on the mask. The illuminator system also homogenizes (makes uniform) the intensity distribution of the light beam 110 across the mask.

The scanner 115 can include, among other features, a lithography controller 140, air conditioning devices, and power supplies for the various electrical components. The lithography controller 140 controls how layers are printed on the wafer 120. The lithography controller 140 includes a memory 142 that stores information such as process recipes and also may store information about which repetition rates may be used or are preferable as described more fully below.

The wafer 120 is irradiated by the light beam 110. A process program or recipe determines the length of the exposure on the wafer 120, the mask used, as well as other factors that affect the exposure. During lithography, a plurality of pulses of the light beam 110 illuminates the same area of the wafer 120 to constitute an illumination dose. The number of pulses N of the light beam 110 that illuminate the same area can be referred to as an exposure window or slit and the size of this slit can be controlled by an exposure slit placed before the mask. In some implementations, the value of N is in the tens, for example, from 10-100 pulses. In other implementations, the value of N is greater than 100 pulses, for example, from 100-500 pulses.

One or more of the mask, the objective arrangement, and the wafer 120 can be moved relative to each other during the exposure to scan the exposure window across an exposure field. The exposure field is the area of the wafer 120 that is exposed in one scan of the exposure slit or window.

Figure 2:
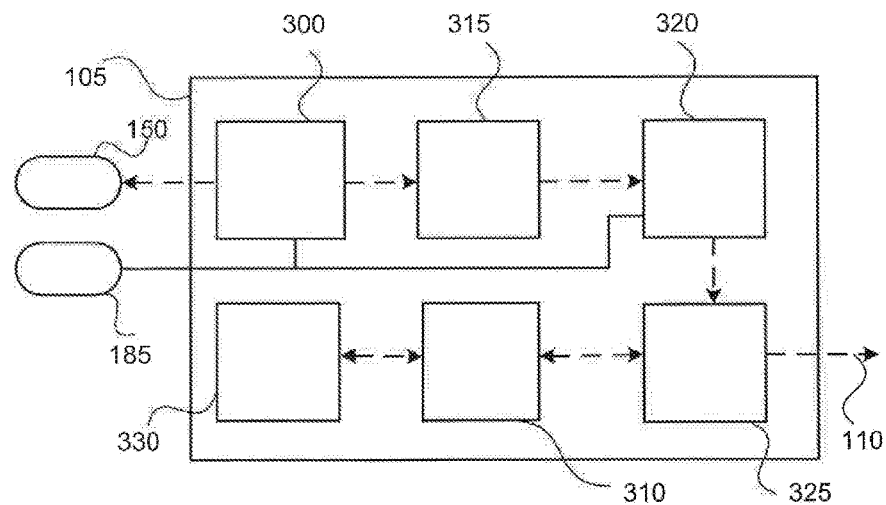
FIG. 2 is a functional block diagram of a light source according to an aspect of the present invention for the system of FIG. 1.

Referring to FIG. 2, an exemplary optical source 105 is a pulsed laser source that produces a pulsed laser beam as the light beam 110. As shown in the example of FIG. 2, the optical source 105 is a two-stage laser system that includes a master oscillator (MO) 300 that provides a seed light beam to a power amplifier (PA) 310. The master oscillator 300 typically includes a gain medium in which amplification occurs and an optical feedback mechanism such as an optical resonator. The power amplifier 310 typically includes a gain medium in which amplification occurs when seeded with the seed laser beam from the master oscillator 300. If the power amplifier 310 is designed as a regenerative ring resonator then it is described as a power ring amplifier (PRA) and in this case, enough optical feedback can be provided from the ring design. The master oscillator 300 enables fine tuning of spectral parameters such as the center wavelength and the bandwidth at relatively low output pulse energies. The power amplifier 310 receives the output from the master oscillator 300 and amplifies this output to attain the necessary power for output to use in photolithography.

The master oscillator 300 includes a discharge chamber having two elongated electrodes, a laser gas that serves as the gain medium, and a fan circulating the gas between the electrodes. A laser resonator is formed between a spectral feature selection system 150 on one side of the discharge chamber and an output coupler 315 on a second side of the discharge chamber. The optical source 105 can also include a line center analysis module (LAM) 320 that receives an output from the output coupler 315, and one or more beam modification optical systems 325 that modify the size and/or shape of the laser beam as needed. The line center analysis module 320 is an example of one type of measurement system that can be used to measure the wavelength (for example, the center wavelength) of the seed light beam. The laser gas used in the discharge chamber can be any suitable gas for producing a laser beam around the required wavelengths and bandwidth, for example, the laser gas can be argon fluoride (ArF), which emits light at a wavelength of about 193 nm, or krypton fluoride (KrF), which emits light at a wavelength of about 248 nm.

The power amplifier 310 includes a power amplifier discharge chamber, and if it is a regenerative ring amplifier, the power amplifier also includes a beam reflector 330 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam is amplified by repeatedly passing through the power amplifier 310. The beam modification optical system 325 provides a way (for example, a partially-reflecting mirror) to in-couple the seed light beam and to out-couple a portion of the amplified radiation from the power amplifier to form the output light beam 110.

The line center analysis module 320 monitors the wavelength of the output of the master oscillator 300. The line center analysis module can be placed at other locations within the optical source 105, or it can be placed at the output of the optical source 105.

Figure 3:
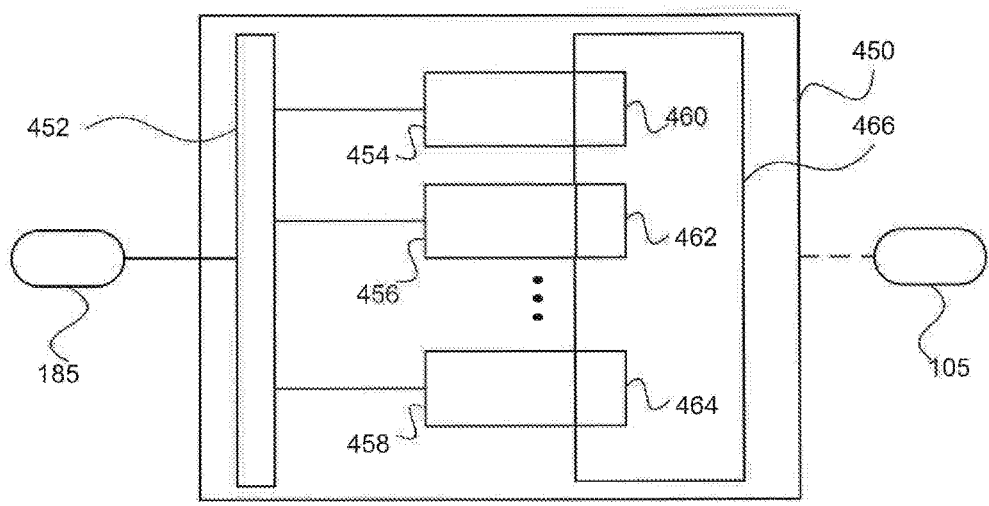
FIG. 3 is a functional block diagram of an optical controller according to an aspect of the present invention for the system of FIG. 1.

The spectral feature selection system 150 receives a light beam from the optical source 105 and finely tunes the spectral output of the optical source 105 based on the input from the control system 185. Referring to FIG. 3, an exemplary spectral feature selection system 450 is shown that couples to light from the optical source 105. In some implementations, the spectral feature selection system 450 receives the light from the master oscillator 300 to enable the fine tuning of the spectral features such as wavelength and bandwidth within the master oscillator 300.

The spectral feature selection system 450 can include a control module such as spectral feature control module 452 that includes electronics in the form of any combination of firmware and software. The module 452 is connected to one or more actuation systems such as spectral feature actuation systems 454, 456, 458. Each of the actuation systems 454, 456, 458 can include one or more actuators that are connected to respective optical features 460, 462, 464 of an optical system 466. The optical features 460, 462, 464 are configured to adjust particular characteristics of the generated light beam 110 to thereby adjust the spectral feature of the light beam 110. The control module 452 receives a control signal from the control system 185, the control signal including specific commands to operate or control one or more of the actuation systems 454, 456, 458. The actuation systems 454, 456, 458 can be selected and designed to work cooperatively.

Each optical feature 460, 462, 464 is optically coupled to the light beam 110 produced by the optical source 105. In some implementations, the optical system 466 is a line narrowing module. The line narrowing module includes as the optical features dispersive optical elements such as reflective gratings and refractive optical elements such as prisms, one or more of which can be rotatable. An example of this line narrowing module can be found in U.S. Pat. No. 8,144,739, titled "System Method and Apparatus for Selecting and Controlling Light Source Bandwidth," and issued on Mar. 27, 2012 (the '739 patent), the specification of which is herein incorporated by reference. In the '739 patent, a line narrowing module is described that includes a beam expander (including the one or more prisms) and a dispersive element such as a grating.

Each of the actuators of the actuation systems 454, 456, 458 is a mechanical device for moving or controlling the respective optical features 460, 462, 464 of the optical system 466. The actuators receive energy from the module 452, and convert that energy into some kind of motion imparted to the optical features 460, 462, 464 of the optical system. For example, in the '306 application, actuation systems are described such as force devices (to apply forces to regions of the grating) and rotation stages for rotating one or more of the prisms of the beam expander. The actuation systems 454, 456, 458 can include, for example, motors such as stepper motors, valves, pressure-controlled devices, piezoelectric devices, linear motors, hydraulic actuators, voice coils, etc.

In general, the control system 185 includes one or more of digital electronic circuitry, computer hardware, firmware, and software. The control system 185 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 185 can also include one or more input devices (such as a keyboard, touch screen, microphone, mouse, hand-held input device, etc.) and one or more output devices (such as a speaker or a monitor). The control system 185 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits).

The control system 185 includes a spectral feature analysis module, a lithography analysis module, a decision module, a light source actuation module, a lithography actuation module, and a beam preparation actuation module. Each of these modules can be a set of computer program products executed by one or more processors. The spectral feature analysis module receives the output from the metrology system 170. The lithography analysis module receives information from the lithography controller 140 of the scanner 115. The decision module receives the outputs from the analysis modules and determines which actuation module or modules need to be activated based on the outputs from the analysis modules. The light source actuation module is connected to one or more of the optical source 105 and the spectral feature selection system 150. The lithography actuation module is connected to the scanner 115, and specifically to the lithography controller 140. The beam preparation actuation module is connected to one or more components of the beam preparation system 112.

It is possible for the control system 185 to include other modules. Additionally, it is possible for the control system 185 to be made up of components that are physically remote from each other. For example, the light source actuation module can be physically co-located with the optical source 105 or the spectral feature selection system 150.

In general, the control system 185 receives at least some information about the light beam 110 from the metrology system 170 and a spectral feature analysis module performs an analysis on the information to determine how to adjust one or more spectral features (for example, the bandwidth) of the light beam 110 supplied to the scanner 115. Based on this determination, the control system 185 sends signals to the spectral feature selection system 150 and/or the optical source 105 to control operation of the optical source 105.

The optical source control system 185 causes the optical source to operate at a given repetition rate. More specifically, scanner 115 sends a trigger signal to the optical source 105 for every laser pulse (i.e., on a pulse-to-pulse basis) and the time interval between those trigger signals can be arbitrary, but when the scanner 115 sends trigger signals at regular intervals then the rate of those signals is a repetition rate. The repetition rate can be a rate requested by the scanner 115. Preferably, the photolithography system 100 provides the user with the ability to choose any one of many repetition rates depending on the needs of a particular application. Because performance characteristics may vary with repetition rate, however, it is desirable to limit the scanner 115 to the use of repetition rates which are known to result in in-specification performance (or, conversely, to prevent the operator or scanner 115 from using repetition rates which are known to result in out-of-specification performance, or at least to provide the scanner 115 with information about which rates are more likely to result in in-specification performance). It is also desirable to be able to determine acceptable repetition rates periodically and on an ad hoc (for each laser in situ) basis because performance variation with repetition rate may vary laser to laser, even for lasers which are of the same type, and may also vary with the operating age of the system, so that definition of an a priori global "inclusion zone" of accepted repetition rates (or "exclusion zone" of prohibited repetition rates) is not in general practical for all lasers of the same type or even for a single laser over its entire lifetime. Even if repetition rates are not expressly allowed or disallowed they may be assigned a score based on the likelihood that they will result in acceptable performance.

These goals can be achieved by use of an automated calibration system which can identify and/or score "good" repetition rates. The scoring of "good" repetition rates could be binary in the sense that the rate is either allowed (and so available for use) or disallowed (and so not available for use) based on whether or not the rate yields or is sufficiently likely to yield in-specification performance. Alternatively, the automated calibration system could score rates with rates getting higher scores, and thus being preferred, if they are more likely to yield in specification performance and with rates less likely to yield in-specification performance being assigned lower scores. In such an embodiment the rates assigned lower scores would not be absolutely disallowed and the scanner 115 could use them if it is preferred not to use a rate having a better score based on other technical considerations.

In such a system the illumination system 130 measures its own performance at various repetition rates and records performance as a function of repetition rate. The illumination system 130 then communicates information indicative of the results of the measurement to the scanner 115. The scanner 115 then uses the scores that are indicative of the results of the measurement to decide which repetition rate to use based on its information on the requirements of the wafer being processed. As stated, in this case, the illumination system would send the scanner 115 performance scores instead of repetition rates.

As an example, a scanner recipe could specify a low or high precision mode which would affect how the scores would be translated to preferred or allowable repetition rates. This would permit the user to decide what trade off to make between the potential for limiting a number of allowed repetition rates to lower repetition rates (thus reducing pulse count and increasing tool lifetime) or to higher repetition rates leading to maximum imaging performance at the cost of tool lifetime.

Performance can be measured according to the characteristics of the emitted light. Performance can also be measured according to the operational characteristics of the actuators described above, such as their available dynamic range. Performance can also be measured according some combination of these characteristics or other parameters. The characteristics to be used in selecting/scoring the repetition rates can be predefined or the characteristics could be selectable or even determined dynamically.

The scoring for a given rate can be determined directly based on a measurement taken at that rate or it can be inferred. For example, the illumination system 130 could take performance measurements for a subset of rates included in an ensemble of rates and then infer performance at other rates in the ensemble using a mathematical operation such as interpolation.

Preferably such an illumination system 130 would conduct periodic automatic calibration of laser performance as a function of repetition rate, and use a set of criteria to automatically select which repetition rates can be used by the photolithography system 100 while maintaining the required performance. The illumination system 130 can then provide the allowed repetition rates to a scanner dose controller in lithography controller 140 to use as part of the existing dose recipe calculations (including dose on wafer, scan speed, laser energy output, etc.).

According to one embodiment, the control system 185 makes a determination of whether the one or more of the measured characteristics meet predetermined specification criteria, for example, whether the measured characteristics are within acceptable ranges, and stores this information. The control system 185 can store the measured values in association with the repetition rate R at which the values were measured and then make a determination were those values were acceptable at a later time. It is also possible for the control system 185 simply to store an indication for each repetition rate R whether the values measured for that repetition rate were acceptable.

Preferably such automatic calibration could be performed periodically during a gas refill process. For example, the XLR 700ix source manufactured by the assignee of the present application includes a calibration called Automated Gas Optimization (AGO) which runs on every refill and which could be modified to include a repetition rate calibration step. AGO is described in U.S. Pat. No. 8,411,720 titled "System and Method for Automatic Gas Optimization in a Two-Chamber Gas Discharge Laser System" which issued Apr. 2, 2013, and is commonly assigned with this application, the specification of U.S. Pat. No. 8,411,720 being incorporated herein by reference. The XLR 700ix source interfaces, for example, with the NXT:1970 and NXT: 1980 scanners made by ASML Netherlands B.V.

As mentioned, the process of running the illumination system 130 at various repetition rates and measuring one or more performance characteristics at those rates occurs while the illumination system 130 is running, that is, online, but while its light is not being used by the scanner 115, that is, during a non-exposure period. Later, when the scanner 115 seeks to use a particular repetition rate, the control system 185 determines whether that repetition rate yielded in-specification performance during the online calibration. If that repetition rate yielded in-specification performance then the control system 185 can allow use of that repetition rate.

Alternatively, the control system 185 can communicate a list of allowed repetition rates to the scanner 115 where it is stored in a lookup table in memory 142. The scanner 115 then simply picks the repetition rate to be used from this list of allowed repetition rates. In other words, the illumination system 130 makes known reliable values of repetition rates available to the scanner 115 as allowed values. The scanner 115 stores the allowed repetition rates in a lookup table for use by the scanner 115 as part of the scanner dose recipes. The illumination system 130/scanner system is then permitted to use those allowed repetition rates. The scanner dose controller in lithography controller 140 may then use to the allowed rates as part of dose recipe calculations (including, dose on wafer, scan speed, laser energy output, etc.).

Thus, the source (illumination system 130) performs a self-assessment of its performance at various repetition rates. It then communicates the results of that assessment (or information based at least in part on that assessment) to the scanner 115. The scanner 115 can use the information to populate a lookup table of "good" rates. It is also possible that the table can be updated while the illumination system 130 is illuminating a wafer 120. It is also possible that the scanner 115 can be configured to query the illumination system 130 before using a given repetition rate to ascertain whether the rate can be used with satisfactory probability that the rate will result in in-specification performance.

Figure 4:
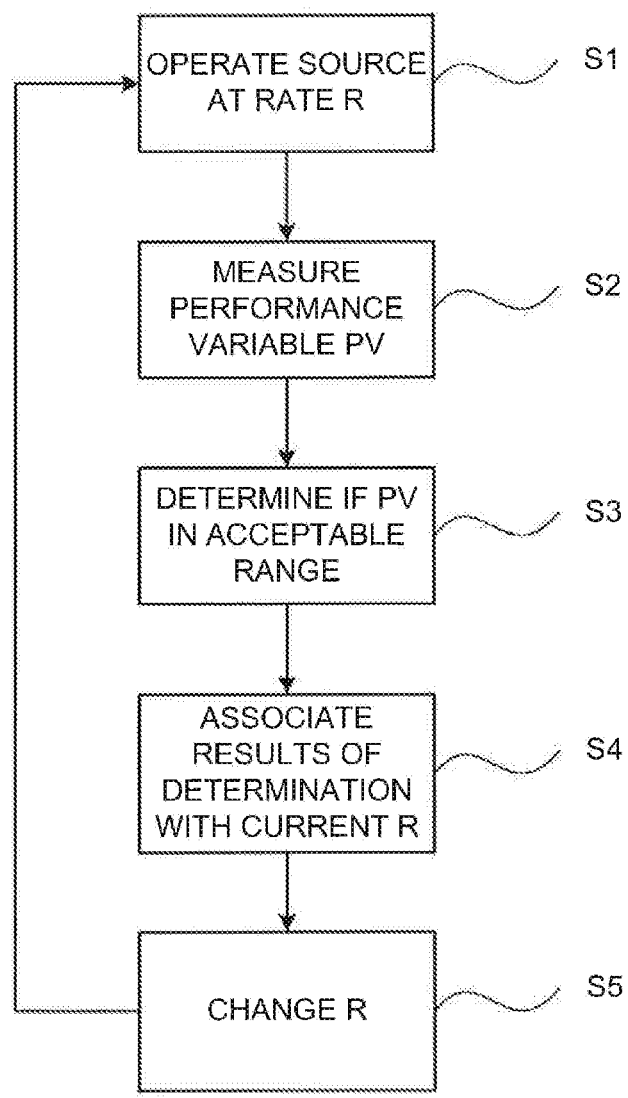
FIG. 4 is a flowchart describing a calibration process according to an aspect of the present invention.

An exemplary calibration routine as might be carried out by an automatic calibration system according to the invention is shown in the flowchart in FIG. 4. It will be understood in general most or all of these steps would be performed by the illumination system 130 but that is not necessary and the steps could be performed by some other component of the photolithography system 100. In a first step S1, conducted while the illumination system 130 is still online but not while its output is being used by the scanner 115 such as during a gas refill cycle, the illumination system 130 is operated at a repetition rate R. Performing the calibration process during a scheduled downtime prevents having to schedule additional downtime for the calibration process as would be required if a there were downtime dedicated exclusively to calibration. In a step S2 one or more operating performance variables of the laser such as bandwidth, wavelength, beam width stability, and energy stability are measured by the illumination system 130 while the illumination system 130 is operating at the repetition rate R. In step S3 it is determined whether the values measured in step S2 are within predetermined acceptable ranges for those variables as measured by the illumination system 130's internal metrology systems as described above. In step S4 an indication is stored in association with the repetition rate R indicative of the results of the determination made in step S3. In step S5 the repetition rate R is changed to a new repetition rate and steps S1 through S4 are repeated for as many values of R as desired. The new value of R can obtained by incrementing the immediately prior value by a fixed amount, or the value of R can be changed using other methods including decreasing R by a fixed amount, increasing or decreasing R by variable (including random) amounts, or by testing only those values of R that are expected to be of interest as explained more fully below.

Later, when the illumination system 130 is in an operational mode, the scanner 115 can check whether a repetition rate it wants to use is a permitted or recommended repetition rate or select a repetition rate from a list of allowed or recommended repetition rates. The illumination system 130 can also communicate "good" repetition rates when it is not in an operational mode. For example, repetition rates that support in-specification performance can be communicated to the scanner 115. The scanner 115 can then store these rates in a lookup table and can select one of them for a given desired dosing. If the desired repetition rate is permitted then the system runs the illumination system 130 at that repetition rate without any warnings or interference. If, on the other hand, the desired repetition rate is not permitted then the illumination system 130 can provide the scanner 115 with an indication that the requested repetition rate may result in out-of-specification performance or it may prohibit the scanner 115 from operating the illumination system 130 at that requested repetition rate or both.

Figure 5A:
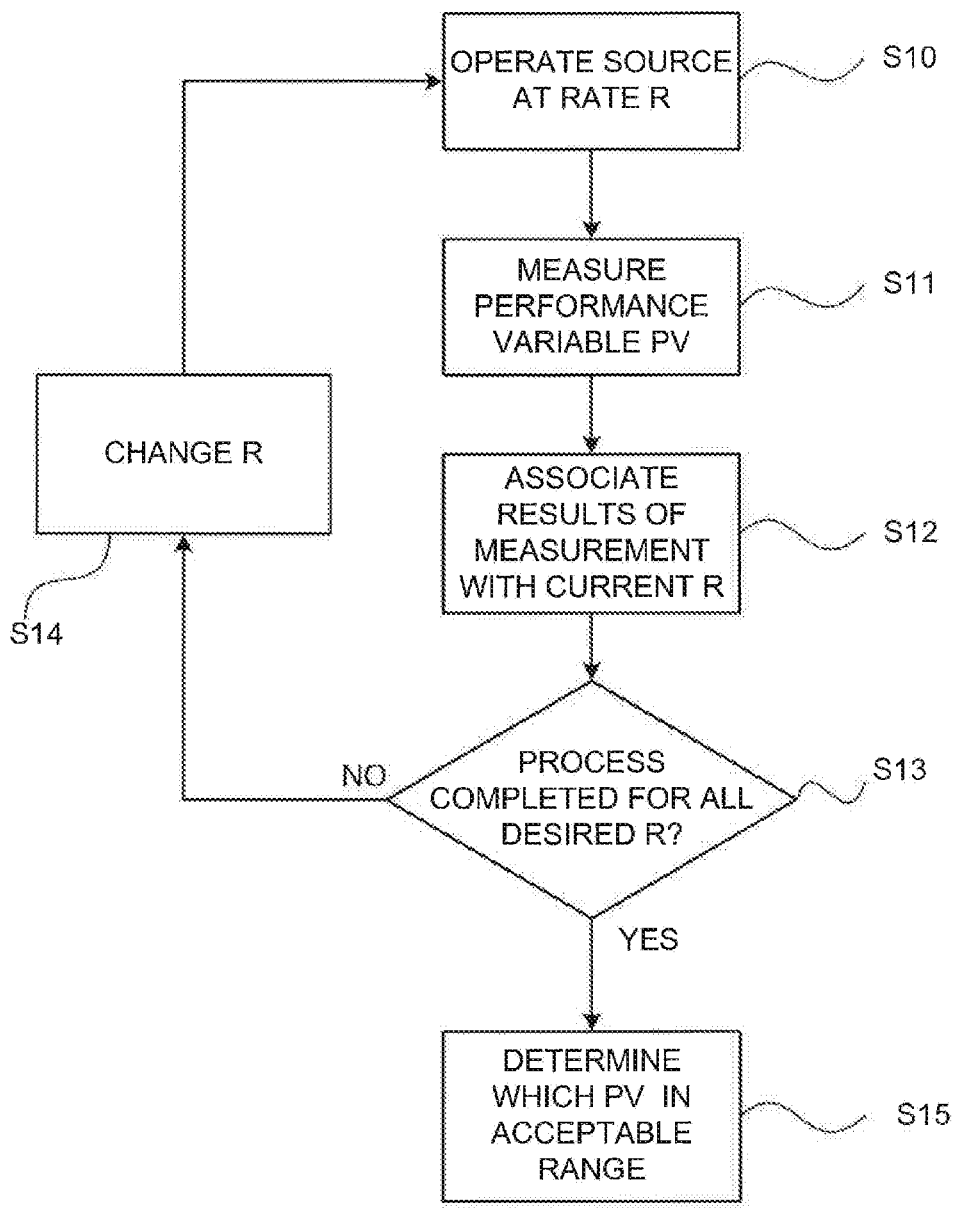
FIG. 5A is a flowchart describing another calibration process according to another aspect of the present invention.
Figure 5B:
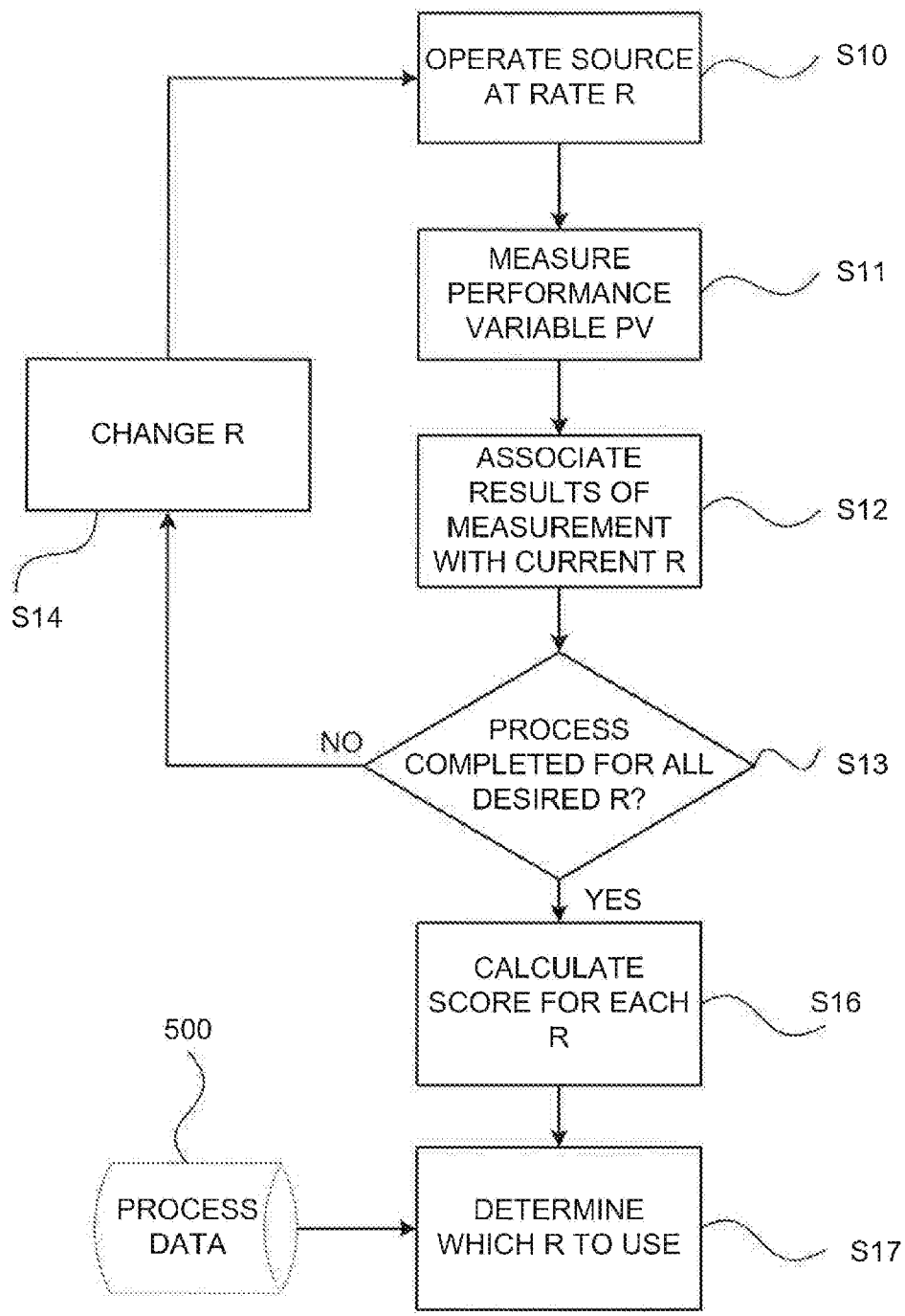
FIG. 5B is a flowchart describing a repetition rate selection process according to another aspect of the present invention.

An example of a variation of the process of FIG. 4 is shown in the flowchart in FIG. 5B. It will again be understood in general most or all of these steps would be performed by the illumination system 130 but that is not necessary and the steps could be performed by some other component of the photolithography system 100. In FIG. 5, in a step S10, the illumination system 130 operates at a repetition rate R. In a step S11 one or more performance variables are measured for that repetition rate. In a step S12 the results of the measurements carried out in step S11 are associated with the current repetition rate. In a step S13 it is determined whether the process carried out in steps S10 through S12 has been completed for all desired repetition rates. If it is determined in step S13 that the calibration process has not been completed for all desired repetition rates, then the repetition rate is changed in step S14 and steps S10 to step S12 are carried out at the new repetition rate. If it is determined in step S13 that the process has been completed for all desired repetition rates, it is then determined in step S15 which measured performance variables were in acceptable ranges. Alternatively in step S15 the illumination system 130 can assign a score to the repetition rate R indicative of the likelihood that the repetition rate R will result in in-specification performance.

A process for determining which repetition rate R to use as an operational repetition rate is shown in FIG. 5B. The scanning and measurement steps S10 through S13 are in general the same as the like numbered steps in FIG. 5A. The process of FIG. 5B, however, has a step S16 in which a score is assigned to each of the repetition rates measured in the scan. In a step S17 this score is used, in general but not necessarily by the scanner, to determine which repetition rate R to use as an operational repetition rate. As shown, the determination in step S17 is made based both on the scores and also on process data such as process recipes and requirements stored in a memory 500.

The illumination system 130 can also or alternatively use parameters other than the characteristics of the light produced by the illumination system 130. For example, the system could make use of the states of the actuators 454, 456, and 458 described above to determine available dynamic range of the laser feedback controllers in selecting "good" repetition rates.

Thus the illumination system 130 can make a determination of which repetition rates are permitted or preferred (recommended) any time after the one or more performance variables has been measured. For example, the illumination system 130 can make the determination essentially concurrently with the measurement or the illumination system 130 can store the measurement in association with the repetition rate at which the measurement was obtained and make a determination at a later time. Also, the illumination system 130 can store the actual measurements in association with repetition rates or store a value for each repetition rate indicative of whether that repetition rate yielded in-specification performance. Thus, the determination of whether a given rate is good (resulted in or is likely to result in in-specification performance) or bad (resulted in or is likely to result in out-of-specification performance) can be made after all values have been stored, or on the fly (concurrently with measurement), or some combination of the two. Of course, the illumination system 130 could store a table of disallowed rates rather than allowed rates, or it could store both.

The scanner 115 provides illumination system 130 a set of discrete allowed "base" repetition rates as a part of an interface specification. The scanner 115 also provides the illumination system 130 with a reference (or maximum) repetition rate to be used during runtime. The reference repetition rate might typically be about 6 kHz but other reference repetition rates can be used. Automated gas optimization will optimize at that reference repetition rate.

In selecting a repetition rate for operation, the scanner 115 can query the illumination system 130 for information regarding a particular repetition rate the scanner 115 may plan to request. The illumination system 130 responds with the information derived from the calibration scan. In one aspect, the illumination system 130 responds with a binary "allowed" or "disallowed" (OK/NOK) based on the information obtained during the repetition rate calibration. If the repetition rate is allowed then the scanner 115 can operate within ±2 Hz of the selected repetition rate.

According to another aspect, the scanner 115 is configured to be able to cause the illumination system 130 to initiate a repetition rate calibration. Alternatively or in addition the illumination system 130 may request the scanner 115 to initiate a repetition rate calibration.

Preferably, the illumination system 130 can perform the repetition rate calibration in a relatively short period of time, on the order of a minute. The illumination system 130 can also be configured to perform repetition rate calibrations of varying resolutions in order to control the overall duration of the calibration process. For example, the illumination system 130 can be configured to perform a "high resolution" calibration where the repetition rate is incremented by 10 Hz in each scan step, which would result in measurements being taken at about 400 repetition rates at 300 pulses per burst. Such a scan would typically take on the order of 75 seconds. Or the illumination system 130 can be configured to perform a "medium resolution" calibration where the repetition rate is incremented by 15 Hz in each scan step, which would result in measurements being taken at about 270 repetition rates at 300 pulses per burst. Such a scan would typically take on the order of 50 seconds. Or the illumination system 130 can be configured to perform a "medium resolution" calibration where the repetition rate is incremented by 20 Hz in each scan step, which would result in measurements being taken at about 200 repetition rates at 500 pulses per burst. Such a scan would typically take on the order of 50 seconds. Or the illumination system 130 can be configured to perform a "medium resolution" calibration where the repetition rate is incremented by 20 Hz in each scan step, which would result in measurements being taken at about 200 repetition rates at 300 pulses per burst. Such a scan would typically take on the order of 40 seconds. Or the illumination system 130 can be configured to perform a "low resolution" calibration where the repetition rate is incremented by 100 Hz in each scan step, which would result in measurements being taken at about 40 repetition rates at 300 pulses per burst. Such a scan would typically take on the order of 8 seconds.

As will be appreciated, the pulse per burst, or burst size, can be varied from short (e.g., 100 pulses per burst) to medium (e.g., 300 pulses per burst) to long (e.g., 500 pulses per burst). Other numbers of pulses could be used.

The scan pattern may be any one of a number of types. For example, the scan pattern could be linear, with a constant step size between sampled repetition rates. Or the scan pattern could be logarithmic, with the size of steps between sampled repetition rates being decreased logarithmically. This would result in more sampling at higher repetition rates, which would be particularly useful in circumstances where performance variation with repetition rate is expected to be greater at higher repetition rates. Or the scan pattern could be harmonic, with the size of steps between sampled repetition rates being increased harmonically. This would result in more sampling at lower repetition rates, which would be particularly useful in circumstances where performance variation with repetition rate is expected to be greater at lower repetition rates. Another possible scan pattern is a "cushion" scan pattern in which for every few repetition rates, e.g. two, sampled the illumination system 130 reverts back to and takes measurements at a reference repetition rate, e.g. 6 kHz. This scan pattern could be especially advantageous in circumstances where the performance dependence on repetition rate may drift so it is good practice to return to the reference repetition rate from time to time to verify that performance at that reference repetition rate is still what was previously measured as well as or to adjust or normalize the performance of each repetition rate with respect to the reference repetition rate.

Selection/scoring of repetition rates can be based on various parameters or metrics. For example, selection/scoring could be based on the spectral bandwidth of the emitted light. Alternatively or in addition, selection/scoring could be based on the time delay between the time of production of the beam from the first stage of the laser to the time of production of the beam from the second stage of the laser, referred to as DtMopatarget. Alternatively or in addition, selection/scoring could be based on the energy stability of the emitted light. Alternatively or in addition, selection/scoring could be based on the magnitude of the voltage that must be applied to the laser.

Selection/scoring can be based on degree of satisfying an open loop metric within pre-determined bounds, or on degree of satisfying a closed loop control within pre-determined bounds. It may in some circumstances be desirable to minimize the effects of variation of these metrics by using interpolation of measured values or by using their rate of change with respect to change in repetition rate (derivatives).

As an example, the metric could be that actuator timing be within certain preset limits. As another example, the metric could be that energy stability remain within a preset limit, or that voltage offset with respect to operating voltage at a reference repetition rate (e.g., 6 kHz) be within preset limits. As yet another example, the metric could be that energy gain offset with respect to energy gain at a reference repetition rate (e.g., 6 kHz) be within preset limits. As yet another example, the metric could be laser gain or laser efficiency. Alternatively, some combination of these metrics or derivatives of these metrics may be used. Other possible metrics include bandwidth, energy sigma, peak MOPA discharge timing, and commanded voltage, including signals derived from these metrics.

The illumination system 130 can be configured to provide information to the scanner 115 that identifies forbidden repetition rates, i.e., the illumination system 130 can filter out repetition rates not sufficiently likely to result in in-specification performance, or provide information to the scanner 115 that identifies allowed repetition rates, i.e., the illumination system 130 can "filter in" repetition rates that are sufficiently likely to result in in-specification performance. The selection/scoring can be fixed (determined over a single calibration scan) or adaptive (determined over multiple calibration scans with results being averaged, weighted or not).

Figure 6:
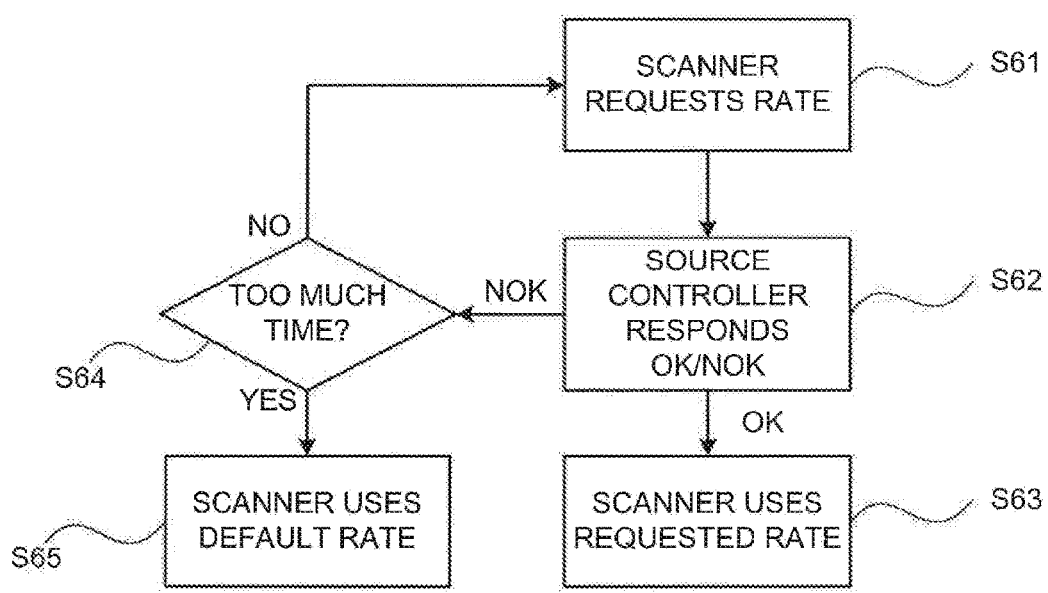
FIG. 6 is a flowchart describing another repetition rate selection process according to another aspect of the present invention.

In one aspect, the scanner 115 can specify to the illumination system 130 an ensemble of repetition rates it may request. The illumination system 130 may calibrate over the entire ensemble or over only a subset of the ensemble. A consideration that may make calibrating over the entire ensemble impractical is the amount of time such a calibration may require. A consideration that may make calibrating over the only a subset of the ensemble undesirable is the possibility that the illumination system 130 will not approve possible "good" repetition rates not included in the subset. There is thus a potential trade-off or time versus flexibility. Whether to calibrate across the entire extent of the ensemble or whether instead to calibrate across only a subset of the ensemble will in general depend on the demands of a particular application, As regards to selection of repetition rates, with reference to FIG. 6, in a step S61, the scanner 115 may request the status of a particular repetition rate, for example, by requesting the illumination system 130 to operate at that repetition rate. According to one aspect, in a step S62 the illumination system 130 may respond to the scanner 115 request with a binary "OK/NOK" status indication based on prior calibration(s). If the illumination system 130 supplies the scanner 115 with an "OK" status indication in step S62 then the scanner 115 can use the requested rate in step S63. If the illumination system 130 supplies the scanner 115 with a "NOK" indication in step S62 then the scanner 115 may request another repetition rate. This process may be repeated until the illumination system 130 responds with an "OK" indication. If this process continues for a period of time or a number of iterations greater than some predetermined duration or number as determined in step S64, the scanner 115/illumination system 130 can fall back to using a default repetition rate in step S65.

Figure 7:
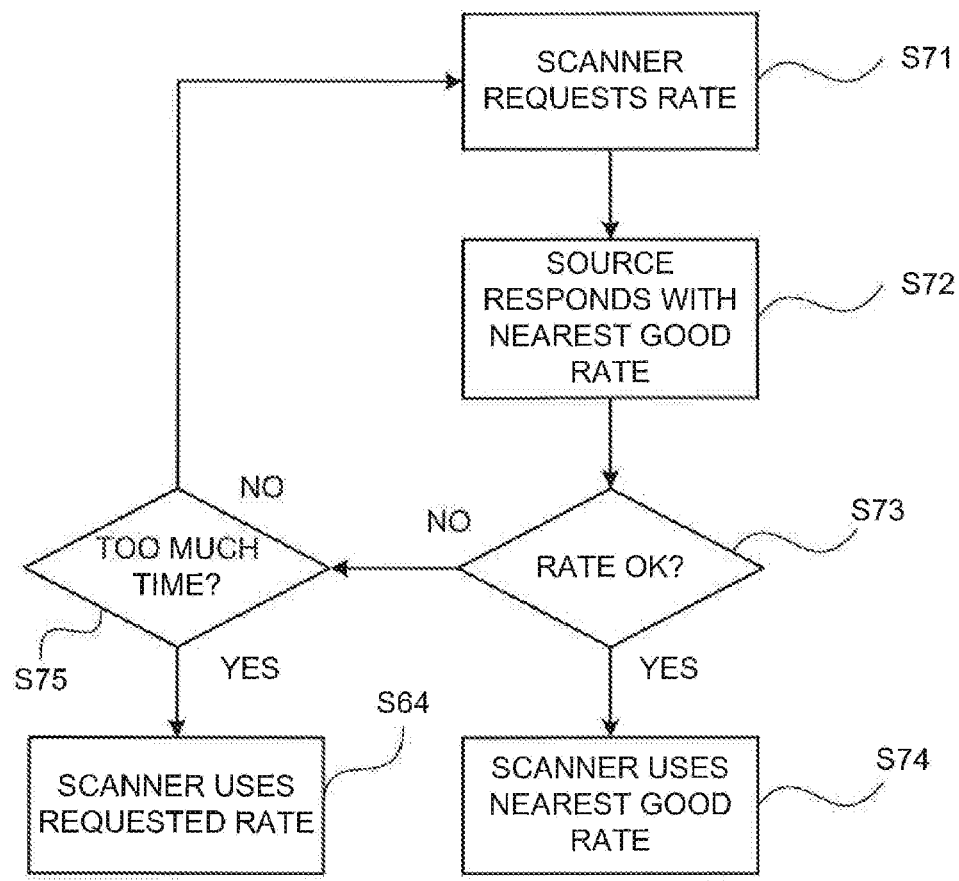
FIG. 7 is a flowchart describing another repetition rate selection process according to another aspect of the present invention.

With reference to FIG. 7, according to another aspect, when the scanner 115 requests a given repetition rate in step S71, the illumination system 130 may respond with an indication of the nearest "good" repetition rate. The scanner 115 may then accept or reject the indicated repetition rate and steps S72. If the scanner 115 accepts the indicated repetition rate in step S73, then the scanner 115 uses that repetition rate. If the scanner 115 rejects the indicated repetition rate and steps S73 it can request another repetition rate. This process may continue until the illumination system 130 indicates a repetition rate that the scanner 115 determines to be acceptable in step S73. If the illumination system 130 does not indicate a repetition rate that is acceptable to the scanner 115 within a predetermined time or number of attempts has determined in step S75 the scanner 115 and illumination system 130 may default to a known good repetition rate in step S64.

It may be known a priori that certain repetition rates will always be acceptable (OK) or unacceptable (NOK). The methods described herein could be altered so that these known good or bad repetition rates are not included in the repetition rates being scanned. This can be accomplished, for example, by using a software mask to preset these known rates as OK or NOK and flagging them as rates which it is not necessary to scan and measure. These masks could be predefined and set or they could be adjusted dynamically during the exposure period for the laser so that which rates are preset to good or bad and so excluded from scan and measurement can be altered automatically.

According to another aspect, the scanner 115 can request a given repetition rate and the illumination system 130 can fire a predetermined number of bursts to determine whether that repetition rate results in in-specification performance. The illumination system 130 then communicates an indication of the results of the calibration to the scanner 115. This has the potential of enabling a relatively fast calibration.

According to another aspect, the illumination system 130 can continuously monitor repetition rates, and select/score repetition rates as one or more of the metrics falls outside an acceptable window defined by higher and lower bounds.

According to another aspect, once a baseline repetition rate table showing selection/scoring of various repetition rates has been created, the illumination system 130 could "dither" (vary by small amounts) the repetition rates in the table. This information could be used to determine the sensitivity of a given metric to variations in repetition rate around the repetition rate in the table, that is, the local derivative of the metric with respect to repetition rate. The table can then be updated to include repetition rates for which the local metric variation is minimized.

During a scan, the output power may be measured and the measured value recorded. Alternatively, the output power can be held constant while other parameters are measured as a function of varied repetition rate and constant power. Similarly, the laser duty cycle can be held constant while other parameters are measured as a function of varied repetition rate and constant duty cycle. Another possible mode of operation is to deliberately randomize the output power and/or the duty cycle and measure parameters as a function of the varied repetition rate and random output power and/or the duty cycle.

In another aspect, the scanner 115 may specify large number of base repetition rates. For example, the scanner 115 might specify repetition rates at 10 Hz resolution over a 4 kHz repetition rate range for a total of about 400 repetition rates. The illumination system 130 can then identify the twenty best repetition rates among the 400 repetition rates. Alternatively, the repetition rate range can be divided into a predetermined number of bins each having a preset width. For example, there could be twenty bins each having a width of about 200 Hz. One repetition rate per bin or segment can be identified with an OK/NOK flag.

In another aspect, the illumination system 130 may maintain a high resolution repetition rate table containing information for each repetition rate as to when the calibration at that repetition rate was most recently performed (age), a metric for that repetition rate (e.g., DtMopa), and an OK/NOK flag. If the metric in the table has been measured for a particular repetition rate, then a default value may be used. The illumination system 130 then measures the metric at a reference repetition rate to obtain a reference metric. Then using the reference metric the illumination system 130 identified the best repetition rate from each bin and flags it as OK or NOK based on metric thresholds. For each of the twenty bins that are flagged as NOK the illumination system 130 then scans the ten repetition rates having the greatest age from the corresponding repetition rate bin and updates their age. The illumination system 130 selects/scores the repetition rate with respect to the reference metric. If this best repetition rate is within a preset variance threshold for the metric, the illumination system 130 flags it as OK. Otherwise the illumination system 130 flags it as NOK.

In another aspect, the illumination system 130 may maintain a repetition rate table containing an entire ensemble of repetition rate scores. This ensemble could be analyzed to determine one or more statistical characteristics of the ensemble, such as, for example, average score, median score, number of acceptable scores, and score range or standard deviation. The system may then adjust one or more system conditions to improve one or more of these statistical characteristics, e.g., to increase the number of acceptable or available repetition rates or increasing the average score of the repetition rates. The system condition to be adjusted could include, for example, the gas pressure in the laser discharge chamber that is part of the master oscillator. In other words the gas pressure in a chamber that is part of the laser could be adjusted to maximize the average score.

In addition to using the scanning methods detailed herein to classify and/or rank repetition rates, the data generated during the scans can also be used for other purposes. For example, the scan data can be supplied to and used to control the operation of other system components.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A system comprising:
   a laser;
   a laser control unit operatively connected to the laser for controlling the laser to scan through a plurality of scanned repetition rates;
   a measurement unit arranged to measure an output from the laser for measuring at least one operating parameter of the laser for at least some of the scanned repetition rates, the operating parameter being laser gain or laser efficiency; and
   an evaluation unit operatively connected to the measurement unit for making a determination of whether a measured value for the operating parameter is within a predetermined range of values for the operating parameter for the at least some of the scanned repetition rates and providing an indication of the result of the determination,
   the laser control unit being operatively connected to the evaluation unit and configured to permit or recommend operation of the laser at one of the scanned repetition rates only if the value stored in association with the scanned repetition rate indicates that the operating parameter was measured to be within the predetermined range for that scanned repetition rate.

2. A system as claimed in claim 1 wherein the laser control unit operatively connected to the laser for driving the laser to scan through a plurality of repetition rates is configured to step the laser through a series of repetition rates where the difference in repetition rate between steps is maintained substantially constant.

3. A system as claimed in claim 1 wherein the laser control unit operatively connected to the laser for driving the laser to scan through a plurality of repetition rates is configured to step the laser through a series of repetition rates where the difference in repetition rate between steps is increased with repetition rate.

4. A system as claimed in claim 1 wherein the laser control unit operatively connected to the laser for driving the laser to scan through a plurality of repetition rates is configured to step the laser through a series of repetition rates where the difference in repetition rate between steps is decreased with repetition rate.

5. A system comprising:
   an illumination system, the illumination system including
      a laser capable of running at multiple repetition rates,
      a laser control unit operatively connected to the laser for driving the laser to operate at ones of a plurality of repetition rates,
      a measurement unit arranged to measure an output from the laser for measuring at least a first operating parameter of the laser for each of the plurality of repetition rates, and
      a scoring unit operatively connected to the measurement unit for determining scoring information for each of the plurality of repetition rates based at least in part on the measured first operating parameter; and
   a scanning system arranged to receive the scoring information from the scoring unit, the scanning system including a scanning system control unit and a memory for storing process data, the scanning system control unit being configured to determine which repetition rates to use based at least in part on the scoring information and the process data, the laser control unit being configured to adjust a second operating parameter as it scans the scanned repetition rates.

6. A photolithography tool including an illumination system and a scanner, wherein the illumination system includes a module configured to generate a score for each of a plurality of repetition rates based on a respective performance characteristic of the illumination system at each of a plurality of repetition rates and wherein the scanner is arranged to receive the scores and to cause the illumination system to operate at a determined repetition rate based on the score of the determined repetition rate and information about a current process, the scanner comprising a controller configured to adjust an operating parameter as it scans the scanned repetition rates.

7. A photolithography tool as claimed in claim 6 wherein the information is a recipe for the current process.

8. A method carried out by a photolithography tool including an illumination system and a scanner, the method comprising:
   a step, performed by the illumination system, of scanning through a plurality of repetition rates while also varying an operating parameter other than repetition rate;
   a step, performed by one of the illumination system and the scanner, of generating a plurality of scores for respective repetition rates;
   a determining step, performed by the scanner, of determining at which repetition rates to operate the illumination system based at least in part on the scores; and
   a step, performed by the scanner, of operating the illumination system at one of the repetition rates determined in the determining step.

9. A method as claimed in claim 8 wherein the scanner is provided with process information and the scanner performs the determining step based at least in part on the process information.

10. A system comprising:
    a laser capable of running at multiple repetition rates;
    a laser control unit operatively connected to the laser for driving the laser to operate sequentially at each of a plurality of repetition rates, a magnitude of a difference between sequential repetition rates increasing or decreasing as a function of repetition rate;
a measurement unit arranged to measure an output from the laser for measuring at least a first operating parameter of the laser for each of the plurality of repetition rates;
a scoring unit operatively connected to the measurement unit for determining a score for each of the plurality of repetition rates based at least in part on the measured operating parameter;
a storage unit operatively connected to the scoring unit for storing an ensemble of scores respectively for each of the plurality of repetition rates;
an analyzer operatively connected to the scoring unit for determining at least one statistical characteristic of the ensemble; and
a controller operatively connected to the analyzer for adjusting a system condition to alter the statistical characteristic.

11. A method comprising:
identifying a group of one or more excluded repetition rates:
operating a laser to run a scan through each of a plurality of repetition rates, the plurality not including any of the excluded repetition rates;
measuring a respective operating parameter for each of the plurality of repetition rates; and
selecting a set of operational repetition rates based at least in part on the respective operating parameters measured in the measuring step.

12. A method as claimed in claim 11 wherein the identifying step comprises including in the group rates that are predetermined to result in unacceptable performance for the laser.

13. A method as claimed in claim 11 wherein the identifying step comprises including in the group rates that are predetermined to result in acceptable performance for the laser.

14. A method as claimed in claim 11 wherein the identifying step comprises selecting rates that are determined dynamically to be excluded from the scan during an exposure.

15. A method as claimed in claim 11 in which inclusion in the group is determined prior to an exposure period of the laser.

16. A method as claimed in claim 11 in which in which inclusion in the group is determined dynamically during an exposure period of the laser.

17. A method as claimed in claim 11 in which values for one or more repetition rates which were not measured during the scanning step are obtained from interpolation of a plurality of values for repetition rates which were measured during the scanning step.

18. A method as claimed in claim 11 in which a laser output power is held substantially constant during each run of a scan for each repetition rate in the scanning step.

19. A method as claimed in claim 11 in which a laser duty cycle is held substantially constant during each run of a scan of for each repetition rate in the scanning step.

20. A method as claimed in claim 11 in which a laser output power is selected to have a random value during each run of a scan of for each repetition rate.

21. A method as claimed in claim 11 in which a laser duty cycle is selected to have a random value during each scan of for each repetition rate.

22. A system comprising:
a laser;
a laser control unit operatively connected to the laser for controlling the laser to scan through a plurality of scanned repetition rates;
a measurement unit arranged to measure a value of a first operating parameter of the laser respectively for each scanned repetition rate;
a storage unit operatively connected to the measurement unit for storing scan data in the form of an indication of the value respectively for each of the plurality of scanned repetition rates; and
a controller operatively connected to the storage unit for selecting a set of operational repetition rates based at least in part on the respective values, the controller being configured to adjust a second operating parameter across the scanned repetition rates.

23. A system as claimed in claim 22 wherein the controller adjusts bandwidth change across the scanned repetition rates.

24. A system as claimed in claim 22 wherein the controller adjusts gain change across the scanned repetition rates.

25. A system as claimed in claim 22 wherein the controller adjusts offset change across the scanned repetition rates.

26. A system as claimed in claim 22 wherein the controller adjusts maximum bandwidth across the scanned repetition rates.

27. A system as claimed in claim 22 wherein the controller adjusts peak energy sigma across the scanned repetition rates.

28. A system comprising:
a laser capable of running at any one of a plurality of repetition rates;
a laser control unit operatively connected to the laser for driving the laser to operate sequentially at at least some of the repetition rates;
a measurement unit arranged to measure an output from the laser for measuring at least one operating parameter of the laser for each of the at least some of the repetition rates;
a scoring unit operatively connected to the measurement unit for determining a score for each of the at least some of the repetition rates based at least in part on the measured operating parameter;
a storage unit operatively connected to the scoring unit for storing an ensemble of scores respectively for each of the at least some of the repetition rates; and
a controller operatively connected to access data in the storage unit wherein the controller compares multiple scores in the ensemble to determine an operational repetition rate at which to operate the laser.

29. A system comprising:
a laser;
a laser control unit operatively connected to the laser for controlling the laser to scan through a plurality of scanned repetition rates;
a measurement unit arranged to measure an output from the laser for measuring at least one operating parameter of the laser for at least some of the scanned repetition rates, the operating parameter being laser gain or laser efficiency; and
an evaluation unit operatively connected to the measurement unit for making a determination of whether a measured value for the operating parameter is within a predetermined range of values for the operating parameter for the at least some of the scanned repetition rates and providing an indication of the result of the determination, the laser control unit being operatively connected to the evaluation unit and configured to permit or recommend operation of the laser at one of the scanned repetition rates only if the value stored in association with the scanned repetition rate indicates that the operating parameter was measured to be within the predetermined range for that scanned repetition rate, and wherein the laser control unit is configured to step the laser through a series of repetition rates where the difference in repetition rate between steps varies as a function of repetition rate.

30. A system as claimed in claim 29 wherein the laser control unit operatively connected to the laser for driving the laser to scan through a plurality of repetition rates is configured to step the laser through a series of repetition rates where the difference in repetition rate between steps is increased with repetition rate.

31. A system as claimed in claim 29 wherein the laser control unit operatively connected to the laser for driving the laser to scan through a plurality of repetition rates is configured to step the laser through a series of repetition rates where the difference in repetition rate between steps is decreased with repetition rate.

* * * * *

UNITED STATES PATENT AND TRADEMARK OFFICE
CERTIFICATE OF CORRECTION

Page 1 of 1

PATENT NO. : 10,727,642 B2
APPLICATION NO. : 15/700754
DATED : July 28, 2020
INVENTOR(S) : Joshua Jon Thornes et al.

It is certified that error appears in the above-identified patent and that said Letters Patent is hereby corrected as shown below:

In the Claims

In Column 18, In Claim 6, Line 3, after "configured to" insert --scan across a plurality of repetition rates and--;

In Column 19, In Claim 11, Line 3, "rates:" should read --rates;--;

In Column 19, In Claim 16, Lines 2-3, "in which in which inclusion" should read --in which inclusion--;

In Column 19, In Claim 19, Line 3, "of for each repetition rate" should read --for each repetition rate--;

In Column 19, In Claim 20, Line 3, "run of a scan of for" should read --run of a scan for--;

In Column 19, In Claim 21, Line 2, "each scan of" should read --each run of a scan--.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*